United States Patent
Matsuki

(10) Patent No.: US 6,737,366 B2
(45) Date of Patent: May 18, 2004

(54) METHOD OF FORMING LOW DIELECTRIC CONSTANT INSULATION FILM FOR SEMICONDUCTOR DEVICE

(75) Inventor: Nobuo Matsuki, Tama (JP)

(73) Assignee: ASM Japan K.K., Tama (JP)

(*) Notice: Subject to any disclaimer, the term of this patent is extended or adjusted under 35 U.S.C. 154(b) by 0 days.

(21) Appl. No.: 10/327,324

(22) Filed: Dec. 20, 2002

(65) Prior Publication Data

US 2003/0124874 A1 Jul. 3, 2003

Related U.S. Application Data

(62) Division of application No. 09/851,809, filed on May 9, 2001, now Pat. No. 6,602,800.

(51) Int. Cl.$^7$ .............................. H01L 21/31
(52) U.S. Cl. ................. 438/788; 438/255; 438/479; 438/677; 438/763
(58) Field of Search ............................ 438/255, 479, 438/677, 763, 788, 778, 792

(56) References Cited

U.S. PATENT DOCUMENTS

| | | | |
|---|---|---|---|
| 4,402,994 A | | 9/1983 | Kobayashi et al. |
| 4,579,609 A | * | 4/1986 | Reif et al. ............ 117/97 |
| 4,997,539 A | | 3/1991 | Komizo et al. |
| 5,688,382 A | | 11/1997 | Besen et al. |
| 5,812,403 A | | 9/1998 | Fong et al. |
| 6,069,094 A | * | 5/2000 | Matsumura et al. ....... 438/788 |
| 6,107,197 A | * | 8/2000 | Suzuki ............... 438/677 |
| 6,245,396 B1 | * | 6/2001 | Nogami ................ 427/562 |
| 6,376,340 B1 | | 4/2002 | Sato et al. |
| 2001/0042512 A1 | * | 11/2001 | Xu et al. ............ 118/723 R |

FOREIGN PATENT DOCUMENTS

| | | |
|---|---|---|
| JP | 4-259378 | 9/1992 |
| JP | 10-140358 | 5/1998 |

\* cited by examiner

*Primary Examiner*—David Nelms
*Assistant Examiner*—Dao H. Nguyen
(74) *Attorney, Agent, or Firm*—Knobbe Martens Olson & Bear, LLP

(57) ABSTRACT

A thin film having a low dielectric constant is formed on a semiconductor substrate by plasma reaction using a method including the steps of: (i) introducing a reaction gas into a reaction chamber for plasma CVD processing wherein a semiconductor substrate is placed on a lower stage; and (ii) forming a thin film on the substrate by plasma reaction while reducing or discharging an electric charge from the substrate surface. The discharging can be conducted by forming in the reaction chamber a upper region for plasma excitation and a lower region for film formation on the substrate wherein substantially no electric potential is applied in the lower region to suppress plasma excitation. An intermediate electrode is used to divide the interior of the reaction chamber into the upper region and the lower region. The discharge can also be conducted by lowering the temperature of the lower stage to condense moisture molecules on the substrate surface. Small nanoparticles can dispose on the substrate without interference with an electric charge.

16 Claims, 4 Drawing Sheets

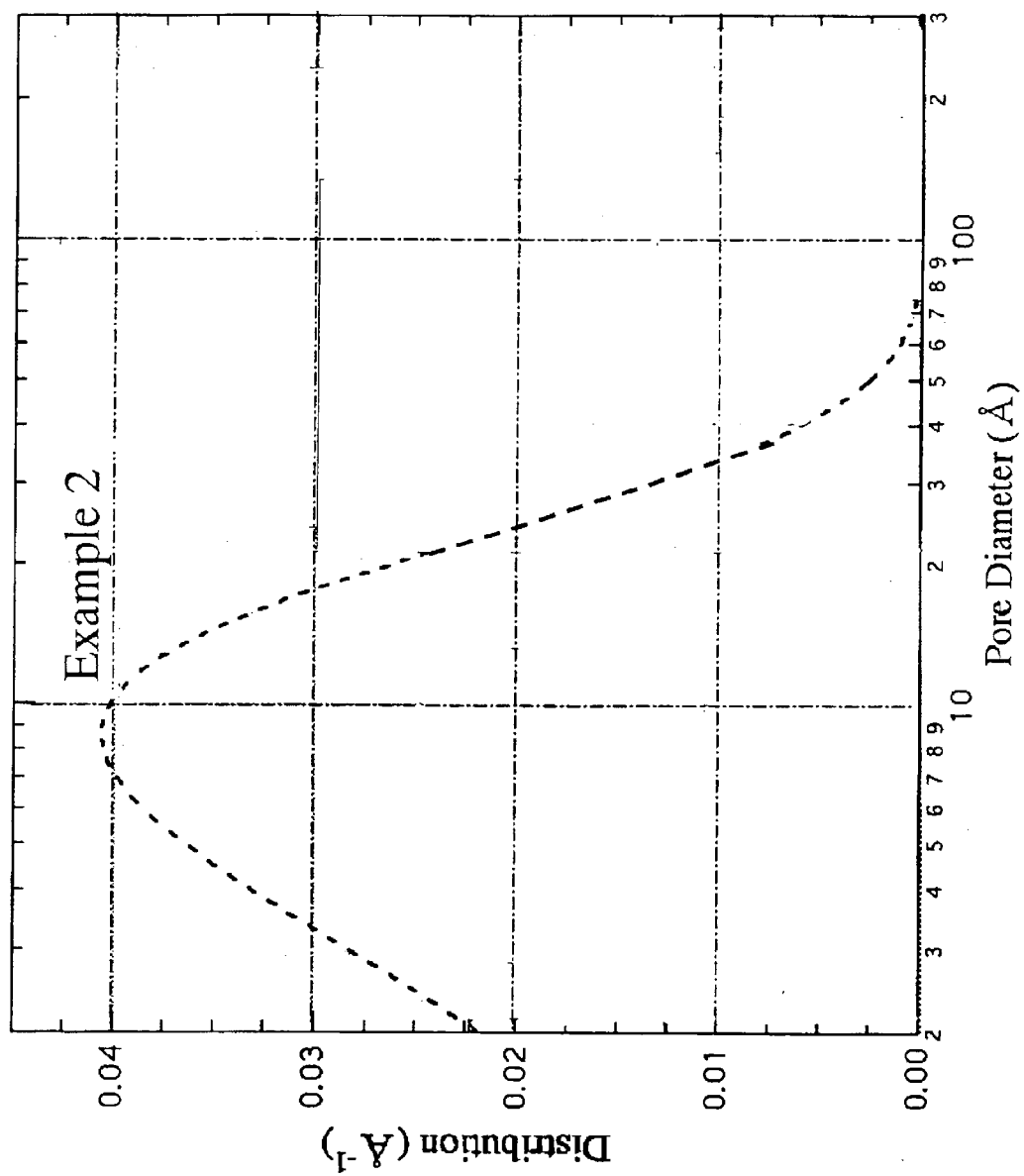

METHOD OF FORMING LOW DIELECTRIC CONSTANT INSULATION FILM FOR SEMICONDUCTOR DEVICE

This application is a divisional of prior application Ser. No. 09/851,809 filed May 9, 2001 now U.S. Pat. No. 6,602,800. The complete disclosure of this previous application is hereby incorporated by this reference thereto.

BACKGROUND OF THE INVENTION

1. Field of the Invention

The present invention relates to a plasma CVD (Chemical Vapor Deposition) method for forming a thin film, and particularly to a method for forming a low dielectric constant insulation film for a semiconductor device.

2. Description of the Related Art

A plasma CVD film-forming method is a technique of forming a thin film on a substrate in a reaction space by generating plasma by bringing microwaves or RF radio-frequency electric power into a reaction chamber. For methods of bringing electric power in, there are the capacity coupling method, the inductive coupling method, the electromagnetic wave coupling method and others. FIG. 1 shows an embodiment of plasma CVD equipment of a parallel-flat-plate type using a capacity coupling method. By placing two pairs of electrically conductive flat electrodes 101, 102 parallel to and opposing each other within a reaction chamber 104, applying RF power 105 to one side and grounding the other side, the plasma is excited between these two electrodes to form a film on a substrate 103. Radio-frequency electric power in a megahertz band of 13.56 MHz or 27 MHz or in a kilohertz band of 400 kHz is applied independently or by synthesizing them. In addition to this, there are the ICP method, the ECR method using microwaves, helicon wave plasma, and surface wave plasma, etc. In such film-forming equipment, a method in which a plasma source is placed at the top and a substrate on which a film is formed is placed at a lower stage, and the lower stage is electrically grounded or a bias voltage is applied, is widely used.

For methods of forming a low dielectric constant film using the plasma CVD, a method of forming a film using Teflon CFx with a low dielectric constant as a material, a technique which forms a low dielectric constant film by reducing polarizability by adding fluorine to a Si material and other methods have been reported. In the case of techniques using fluorine, however, because device reliability deteriorates due to the corrosiveness of fluorine and low adhesion of the material, these low dielectric constant films of k<2.5 have not been put to practical use. When fluorine is not used, to form a low dielectric constant film of k<2.5, lowering film density by forming a film porously is required. In conventional plasma CVD methods, however, due to electric phenomena such as a sheath occurring near a wafer caused by the wafer being exposed to plasma and a self-bias occurring at a wafer substrate, a film becomes dense and it is difficult to form a low dielectric constant film of k<2.5 or less.

Regarding coating methods, examples of forming a low dielectric constant film of k<2.5 or less have been reported including an example of forming a film with a porous structure by controlling sintering conditions and an example of using a supercritical drying method. These methods have not been put to practical use due to many problems, including film quality.

SUMMARY OF THE INVENTION

As described above, to integrate semiconductors and to increase the operating speed, in recent years, low dielectric constant films with a dielectric constant of approximately 2.0 are demanded and forming a film with a dielectric constant of approximately 2.0 using a coating method has been reported. However, a film formed by the conventional coating method has problems that it generally has poor film strength and stability and that film formation costs tend to increase. Generally, a thin film formed using a plasma CVD method is of high quality, and thus the method is used in various fields including manufacturing semiconductor devices. An object of the present invention is to form a low dielectric constant film with a porous structure comprising Si materials using a CVD.

One aspect of the invention is a method for forming a thin film on a semiconductor substrate by plasma reaction, comprising the steps of: (i) introducing a reaction gas into a reaction chamber for plasma CVD processing wherein a semiconductor substrate is placed on a lower stage; and (ii) forming a thin film on the substrate by plasma reaction while reducing or discharging an electric charge from the substrate surface. By reducing or discharging an electric charge from the substrate surface, it is possible to prevent nanoparticles generated by plasma reaction from being repelled from the substrate surface, thereby disposing more nanoparticles on the surface.

In the above, in an embodiment, said reducing or discharging is conducted by forming in the reaction chamber upper region for plasma excitation and a lower region for film formation on the substrate wherein substantially no electric potential is applied in the lower region to suppress plasma excitation, thereby reducing an electric charge from the lower region. The above can be achieved when the upper region and the lower region are divided by an electrically conductive intermediate plate having plural pores through which the reaction gas passes, wherein substantially no electric potential is applied between the intermediate plate and the lower stage. Further, when plasma excitation is suppressed in the lower region, nanoparticles do not substantially increase in size. Thus, small nanoparticles can disposed on the surface without interference with an electric charge, so that a film having a fine structure with a low dielectric constant can be obtained.

In another embodiment, said reducing or discharging can be conducted by lowering the temperature of the lower stage to condense moisture molecules present in the reaction chamber on the substrate, thereby discharging an electric charge from the substrate surface.

When the intermediate plate and the lower temperature control of the lower stage are used in combination, more nanoparticles having a small diameter can disposed on the surface.

The present invention can equally be applied to a CVD apparatus for forming a thin film on a semiconductor substrate by plasma reaction. In an embodiment, a CVD apparatus comprises: (a) a reaction chamber; (b) a reaction gas inlet for introducing a reaction gas into the reaction chamber; (c) a lower stage on which a semiconductor substrate is placed in the reaction chamber; (d) an upper electrode for plasma excitation in the reaction chamber; and (e) an electrically conductive intermediate plate with plural pores disposed between the upper electrode and the lower stage, said intermediate plate dividing the interior of the reaction chamber into an upper region and a lower region.

In the above, in an embodiment, the intermediate plate and the lower stage are electrically connected to maintain the intermediate plate and the lower stage at the same voltage. Further, in another embodiment, a CDV apparatus further comprises a temperature controller which controls the temperatures of the lower stage, the intermediate plate, and the upper electrode at −10° C. −150° C., 50° C.−200° C., and 100° C. −400° C., respectively.

The present invention can also be adapted to a film formed by the above-mentioned methods using a gas containing Si (a Si material gas such as an organosilicon and/or non-organosilicon gas), which film is formed with nanoparticles having a particle size of approximately 50 nm or less (preferably approximately 10 nm or less) and has a low dielectric constant of approximately 2.5 or lower (preferably approximately 2.0 or less). The present invention enables forming of a low dielectric constant film using a plasma CVD method. Use of this low dielectric constant film as an insulation film for the next-generation highly integrated semiconductor elements can substantially improve the operating speed of the semiconductor elements by decreasing delays caused by capacity between wiring.

For purposes of summarizing the invention and the advantages achieved over the prior art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

FIG. 5 is a graph showing the distribution of pore diameters of Example 2.

DETAILED DESCRIPTION OF THE PREFERRED EMBODIMENT

Equipment Configuration

Figure 2:
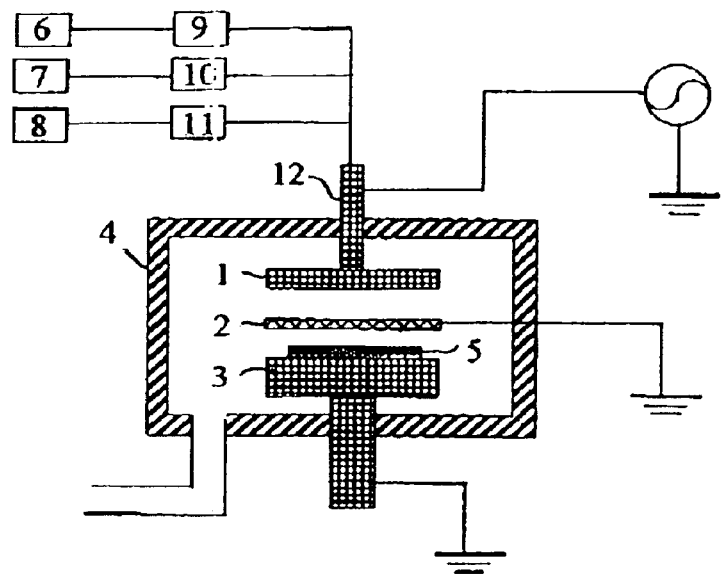
FIG. 2 is a schematic side view showing an embodiment of the apparatus according to the present invention.

FIG. 2 shows an embodiment of film-forming equipment used in this invention. Two electrically conductive electrodes, an upper electrode 1 and an intermediate electrode 2, and three plates of approximately φ250 mm at a lower stage 3 on which a wafer substrate 5 of φ200 mm is placed are provided in a vacuum container 4 which is a reaction chamber. The upper electrode and the intermediate electrode are installed parallel and opposed to each other at an interval of approximately 20 mm, and the intermediate electrode and the lower stage are also installed in the same way which is parallel and opposed to each other at an interval of approximately 20 mm.

On the upper electrode, the intermediate electrode and the lower stage, an independent temperature regulating mechanism is installed respectively and stated temperatures are maintained. Temperatures are maintained at approximately 100° C.–400° C. for the upper electrode, approximately 50° C.–200° C. for the intermediate electrode and approximately 10° C.–150° C. for the lower stage.

A material gas (source gas) containing silicon (such as an organic silicon gas expressed by at least $Si_\alpha O_\beta C_x H_y$ wherein $\alpha$ is an integer of >0 and $\beta$, x and y are integers of >=0) and added gases such as N20, He and Ar are controlled at a stated flow through feeding devices 6~8 and flow regulators 9~11, and after these gases are mixed, they are brought in an inlet 12 at the top of the upper electrode as a reaction gas. On the upper electrode, 500~10,000 pores of φ0.5 mm (3,000 pores formed in the mode for carrying out this invention) are formed, and the reaction gas brought in flows through these pores into a reaction space. The reaction space is exhausted by a vacuum pump and a pre-determined fixed pressure is maintained within the limits of 100 Pa–5000 Pa within which a plasma state can be maintained.

Pulse-modulated radio-frequency electric power of 13.56 MHz is applied to the upper electrode, and the intermediate electrode and the lower stage are electrically grounded. Between the upper electrode and the intermediate electrode, the plasma is excited using the capacity coupling method.

Figure 3:
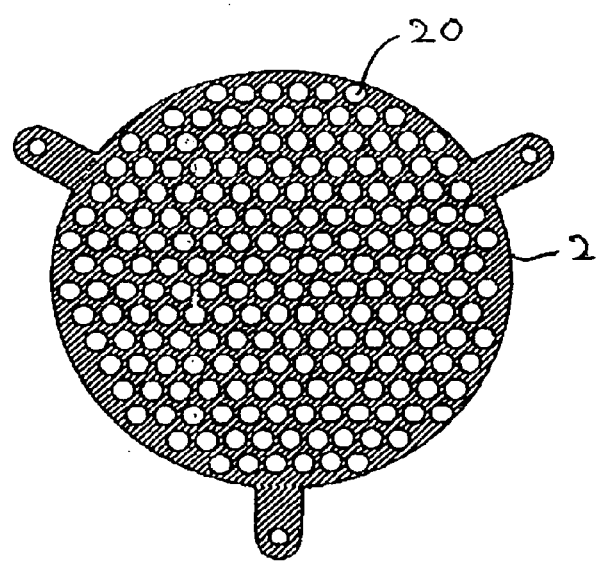
FIG. 3 is a schematic side view showing an embodiment of the intermediate electrode according to the present invention.

As the intermediate electrode 2, an electrode shown in FIG. 3 which is an electrically conductive plate of 5 mm in thickness with 500–10,000 (preferably 1,000–5,000) relatively large pores 20 formed (3,000 pores formed in the mode for carrying out this invention) is used. This intermediate electrode is designed so that it separates the upper region which is in a plasma state with a relatively high temperature, from the lower region beneath the intermediate electrode and at the same time a reaction gas flows from the upper region to the lower region.

In an embodiment, the intermediate electrode may have the following profiles:

(a) The material of the intermediate electrode: conductive material such as Al and AlN.

(b) The size of pores: Approximately 0.5–20 mm.

(c) The size of the intermediate electrode: Approximately the size of a showerhead.

(d) The porosity of the intermediate electrode: Approximately 5–100% (preferably 20–100%) (as long as the material functions as an electrode, the configuration can be in the form of a net.)

(e) The position of the intermediate electrode: The distance between the upper electrode and the intermediate electrode: Approximately 5–30 mm; the distance between the intermediate electrode and the lower electrode: Approximately 10–100 mm.

(f) The thickness of the intermediate electrode: Approximately 2–30 mm.

(g) Production of the intermediate electrode: Production method includes, but is not limited to, mechanically processing a material such as an Al-based material, and then subjecting the surface of the processed material to anodization treatment.

Two Regions Divided by Intermediate Electrode

In the upper region, plasma is excited between the upper electrode and the intermediate electrode and a material gas causes a polymerization reaction. Since nanoparticles are generated in the upper region, their size is determined by a reaction occurring in the upper region. A reaction gas is brought into a reaction space (the upper region), and until it reaches the intermediate electrode, nanoparticles increase in size. The size of nanoparticles is preferably as small as several nm in diameter, and a required nanoparticle diameter can be obtained by controlling time required for a reaction gas to pass through the upper region and reactivity of the upper region. The time for passing through the upper region, i.e., the time for staying in this region, can be controlled by a total flow of a reaction gas per unit of time. The reactivity of the upper region can be changed mainly by regulating RF power. Alternatively, using pulse-modulated RF power with an 'on time' of approximately 50 msec, particle diameter can be controlled by a method of growing nanoparticles by turning the RF power on. As a method of reducing a particle diameter, a minute particle of φ10 nm or less can be generated by reducing the ratio of a Si material gas to be incorporated into a reaction gas.

In the above, in an embodiment, the flow rate of reaction gas in the upper region may be approximately 10–1000 sccm. The RF power exerted in the upper region may be approximately 10 W–1500 W. When pulse-modulated power is applied in the upper region, pulse intervals may be 10–200 msec for activation and 20–100 msec for deactivation. In an embodiment, the size of nanoparticles passing through the intermediate electrode may be approximately 0.5–50 nm.

Nanoparticles generated in the upper space pass through a number of pores formed in the intermediate electrode along with a reaction gas and enter the lower region. Since the electric potential of the intermediate electrode and the lower stage is substantially the same or if they are different, the difference in electric potential is small enough not to excite plasma, the RF power by which plasma is excited does not exist. Ionized particles which enter the lower region become in non-ionized form state after moving in a distance corresponding to the mean free path and colliding with neutral gas molecules. A distance which an ionized particle can move freely, i.e., the mean free path, can be obtained by the following formula with P (Pa) as a pressure inside a reaction chamber:

$$\lambda(mm)=44/p$$

Although, in a high vacuum region of approximately $10^{-4}$ this free path is hundreds of meters which is very long, by increasing the process pressure to 100 Pa–1000 Pa, however, the mean free path shortens to a very short 0.44 mm–0.044 mm. Consequently, plasma ions having passed through the intermediate electrode collide with neutral molecules in a short period of time, preventing the plasma state from spreading into the lower region.

The intermediate electrode divides the reaction chamber into two sections. That is, the lower region of the reaction chamber has no significant presence of plasma, whereas the upper region of the reaction chamber has plasma. If plasma exists significantly in the lower region, all portions exposed to plasma, including a wafer substrate, nanoparticles, and the lower electrode, become negatively charged. Accordingly, nanoparticles are repelled from the surface of the wafer substrate by the force of a static charge, and thus nanoparticles cannot dispose on the surface. By using the intermediate electrode, the intensity of the static charge can be suppressed in the lower region, and disposition of nanoparticles can be enhanced. Further, due to no significant presence of plasma in the lower region, nanoparticles do not significantly increase in size and no new nanoparticles are generated in the region. By disposing small nanoparticles on the surface of the wafer substrate, a film having a fine structure can be formed. If large nanoparticles are disposed on the surface, a film has a coarse structure and when being processed for wiring, a processed surface becomes rough, lowering the quality of a device.

The use of an intermediate electrode can effectively eliminate the above-mentioned static charge phenomena and can suppress the growth of nanoparticles in the lower region. However, even if no plasma is excited in the lower region, static charge phenomena cannot completely be eliminated, resulting in formation of a soft film. The lower stage temperature control described below makes it possible to fully release the electric charge of nanoparticles to the lower stage. When the lower stage temperature control is not conducted, by applying bias voltage to the susceptor, it is possible to enhance the strength of a film.

Lower Stage Temperature Control

Static charge phenomena can be eliminated by lowering the temperature of the lower stage independently of or in combination with the use of the intermediate electrode. The mechanism can be explained as follows:

When the intermediate electrode, if used, and the lower stage are kept at relatively low temperatures, moisture condenses in the lower region and adheres to particles formed in the upper region. Moisture is present in the reaction chamber as a result of the reaction between oxygen and hydrogen. That is, when a material gas containing hydrogen as a constituent element in its molecule (such as organosilicon or hydrocarbon) is used or hydrogen is added to an additive gas, the hydrogen and oxygen react to produce H2O in the reaction gas. The moisture condenses when being cooled in the lower region. The vapor pressure of water at 12° C. is 10 Torr (133 Pa). Thus, if the pressure of the reaction chamber is approximately 10 Torr, moisture present in the reaction gas condenses when the temperature is lower than 12° C. The condensed moisture adheres to nanoparticles generated in the upper region and the surface of the water substrate. The amount of moisture condensed can be controlled by lowering the temperature of the lower susceptor, increasing the reaction pressure, decreasing the flow of gas, and/or adding hydrogen to generate more moisture, etc.

When nanoparticles accumulate on a wafer, minute particles the size of several tens of nanometers or less do not adhere to a wafer substrate if affected by static charge. By lowering temperatures of the lower space and the lower stage, moisture and material gas by-product molecules (e.g., alcohol such as CH3OH and C2H5OH, ether, and organosilicon, SiOxHy), etc. are caused to adhere to a wafer, and the electric charge charged on a wafer is eliminated, whereby more nanoparticles are accumulated on a wafer.

In an embodiment, an intermediate electrode is used and the lower stage is cooled. This combination is effective to dispose small nanoparticles on a wafer substrate. By maintaining the lower stage and the intermediate electrode at the same electric potential and by keeping the reaction chamber in high pressure, dividing a reaction space by the intermediate electrode becomes effective. Spreading into the lower region plasma excited in the upper region can be prevented and the upper space and the lower space can be maintained at different temperatures, i.e., the upper space at a high temperature and the lower space at a low temperature. In this method, it becomes possible to form nanoparticles by facilitating a vapor-phase polymerization reaction by increasing reactivity in the upper space, and in the lower space to end the reaction and at the same time to condense moisture contained in a reaction gas.

Facilitation of moisture condensation can be realized without the use of an intermediate electrode. If no intermediate electrode is used, the lower stage may be cooled to a temperature lower than room temperature while the upper electrode is heated to approximately 150° C. or higher. In order to maintain a lower region in the reaction chamber at a low temperature, the distance between the upper electrode and the lower stage needs to be more than approximately 40 mm.

Subsequent Treatment

The thin film formation process takes 1–20 minutes. After a film is formed, a wafer is transported to another vacuum container and is thermally treated. A film-formed wafer is transported to a vacuum container in a nitrogen atmosphere and is thermally treated for 10 seconds to 5 minutes at a temperature of approximately 200–450° C. at reduced pressure (approximately 10–500 Pa). During this treatment, HMDS (Hexamethyldisilano: $Si_2(CH_3)_5$) is brought into this container, and hydrophobicity treatment is performed to suppress the hygroscopicity of a film.

Effects of Invention

Using the above-mentioned method, it becomes possible in an embodiment to cause a plasma reaction in a reaction gas in a state where a wafer substrate is not exposed to plasma, and furthermore, in the same embodiment or in another embodiment, to accumulate a product on a wafer substrate in a space where there is substantially no plasma. Consequently, no significant electric phenomena (such as a sheath occurring near a wafer caused by a wafer being exposed to plasma and a self-bias at a wafer substrate) can occur, and it becomes possible to eliminate plasma damage. In the present invention, a film having a dielectric constant as low as 1.2–2.5 can be produced.

This invention enables forming of a low dielectric constant film using a plasma CVD method. Use of this low dielectric constant film as an insulation film for the next-generation highly integrated semiconductor elements can substantially improve the working speed of the semiconductor elements by decreasing delays caused by capacity between wiring.

Analysis of Film

Figure 4:
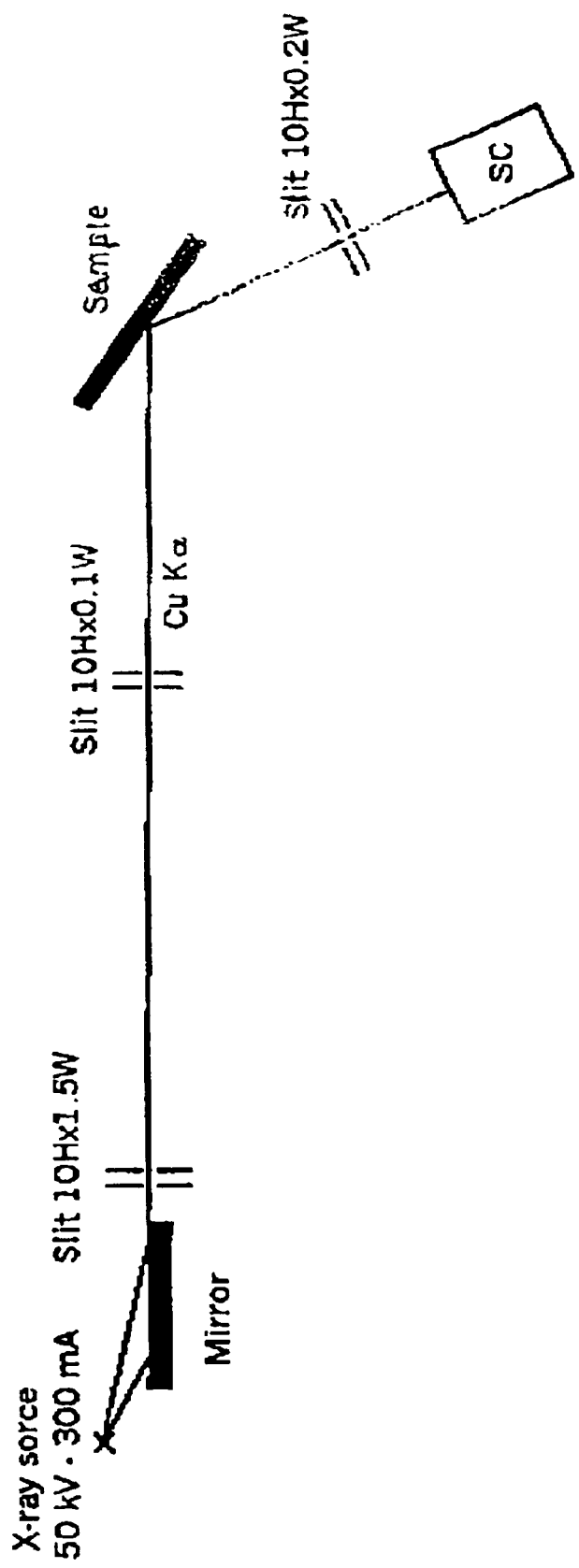
FIG. 4 is a schematic diagram showing a high intensity X-ray diffuse scattering optical system to measure the size of nano-pores of a film.

In the present invention, nanoparticles deposit effectively on a substrate, thereby forming a porous film having nano-pores (with a diameter of 50 nm or less, preferably 10 nm or less, or with a median diameter of 10 nm, preferably 1 nm). The size of the nano-pores is similar to that of the nanoparticles. The size of the nano-pores can be measured by a high intensity X-ray diffuse scattering optical system (e.g., ATX-E™, Rigaku Denki X-Ray Laboratory in Japan). FIG. 4 shows a schematic diagram of this system. The angle of divergence and the intensity of incoming X-ray are 0.045 and $10^9$ cps, for example. X-ray diffuse scattering data are evaluated by comparing measured data with the theoretical intensity of scattering. Practically, the average diameter and the distributions of scattering objects can be determined by calculating the intensity of X-ray diffuse scattering based on a scattering function in for spherical scattering objects having various diameters.

Comparison with Other Techniques

In the case of ion implantation equipment, there is an example which uses an intermediate electrode as a grid electrode in a space between a plasma source and a wafer. The object of the ion implantation equipment is to irradiate ions such as ionized phosphorus, boron, etc. on a Si substrate to implant (dope) these ions on a substrate surface. Consequently, to enable ions to reach a wafer placed on a stage without colliding with other molecules, it is designed that the pressure in a reaction chamber is maintained at a high vacuum of $10^{-4}$ Pa or less, the mean free path of molecules is long to make the number of molecular collisions sufficiently small. Additionally, by applying a voltage difference between an intermediate electrode and a wafer stage, ions passing through the intermediate electrode are selected.

In the ion implantation equipment, since the collision of atoms and molecules in a reaction space is suppressed, a polymerization reaction in a vapor phase does not occur. Additionally, because ions at their high-energy state reach a wafer, these ions are not accumulated on the wafer and are doped inside the wafer. In this invention, by increasing the atmospheric pressure in a reaction space to facilitate a polymerization reaction in a vapor phase, minute particles are generated in a vapor phase. Additionally, these minute particles deposit on a wafer without penetrating inside a wafer substrate.

Experimental Results

EXAMPLE 1

20 sccm of TEOS as a material gas and 80 sccm of O2 as an added gas, Ar:50 sccm, He:50 sccm were mixed, and the mixed gas was brought into a reaction chamber as a reaction gas. The pressure within the reaction chamber was maintained at $2 \times 10^3$ Pa by constantly exhausting the gas with a vacuum pump. 300W 13.56 MHz RF power was applied to an upper electrode. A temperature of the upper electrode, an intermediate electrode and a lower stage was adjusted at a fixed temperature of 170° C., 50° C. and 0° C. respectively. A wafer substrate set in the lower stage was inserted into a vacuum container for thermal treatment after a film was formed, and drying in a $N_2$ atmosphere and hydrophobicity treatment by HMDS were performed. The measured dielectric constant of a film formed under these conditions was 2.05.

EXAMPLE 2

20 sccm of Dimethyldimetoxysilane (DM-DMOS): $(CH_3)_2 Si(OCH_3)_2$ as a material gas, 100 sccm of O2 as an added gas, Ar:50 sccm and He:50 sccm were mixed, and the mixed gas was brought into a reaction chamber as a reaction gas. The pressure within the reaction chamber was maintained at $2 \times 10^3$ Pa by constantly exhausting the gas by a vacuum pump. 800W 13.56 MHz RF power was applied to an upper electrode. A temperature of the upper electrode, an intermediate electrode and a lower stage was adjusted at a fixed temperature of 170° C., 50° C. and 0° C., respectively. A wafer substrate set in the lower stage was inserted in a vacuum container for thermal treatment after a film was formed, and drying in a $N_2$ atmosphere and hydrophobicity treatment by HMDS were performed. The measured dielectric constant of a film formed under these conditions was 1.90, and the film had nano-pores having a diameter of approximately 10 nm or less and the median diameter was approximately 1 nm, which represented the size of nano-particles (FIG. 5, obtained by a high intensity X-ray diffuse scattering optical system, ATX-E™, Rigaku Denki X-Ray Laboratory in Japan).

EXAMPLE 3

20 sccm of Dimethyldimetoxysilane (DM-DMOS): $(CH_3)_2 Si(OCH_3)_2$ as a material gas, 100 sccm of O2 as an added gas, Ar:50 sccm and He:50 sccm were mixed, and the mixed gas was brought into a reaction chamber as a reaction gas. The pressure within the reaction chamber was maintained at $2 \times 10^3$ Pa by constantly exhausting the gas by a vacuum pump. Pulse-modulated 400W 13.56 MHz RF power was applied to an upper electrode. A temperature of the upper electrode, an intermediate electrode and a lower stage was adjusted at a fixed temperature of 170° C., 50° C. and 0° C., respectively. A wafer substrate set in the lower stage was inserted in a vacuum container for thermal treatment after a film was formed, and drying in a $N_2$ atmosphere and hydrophobicity treatment by HMDS were performed. The measured dielectric constant of a film formed under these conditions was 1.90.

Comparison

Figure 1:
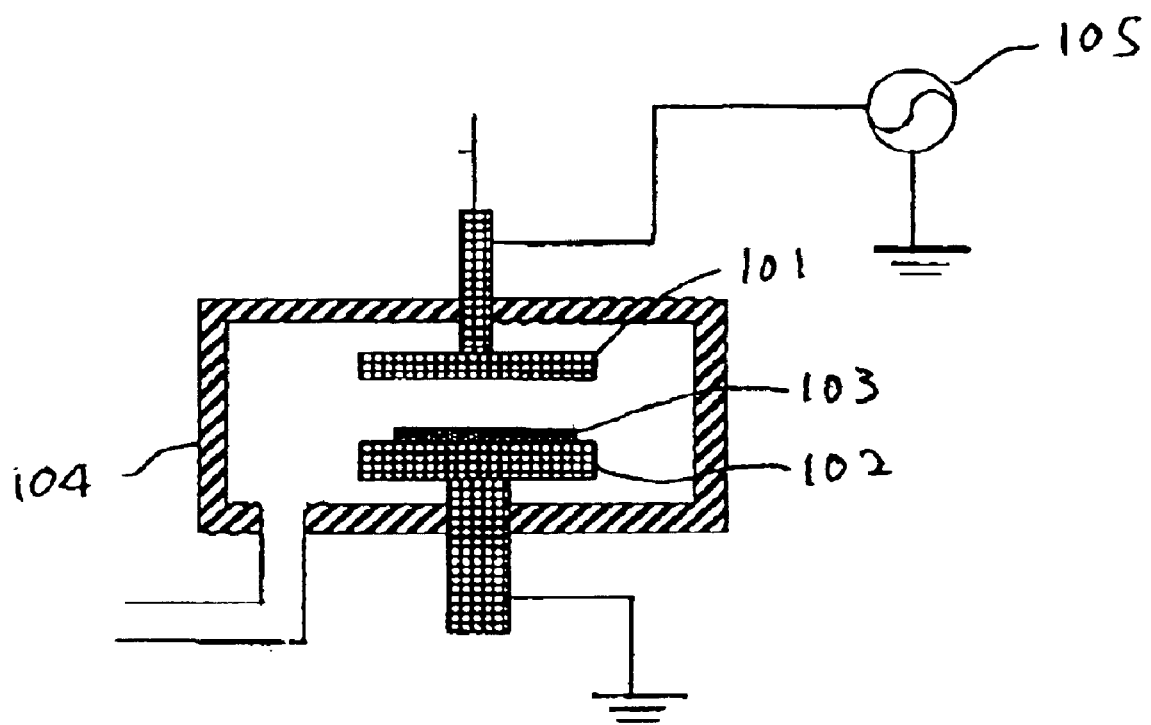
FIG. 1 is a schematic side view showing a conventional CVD apparatus.

An experiment of forming a low dielectric constant film using a plasma CVD method of a parallel-flat-plate type was conducted. FIG. 1 shows an embodiment of plasma CVD equipment used for a film-forming experiment. With an electrically conductive circular plate of φ250 mm used as a lower stage and electrically conductive circular plate of φ250 mm having a limitless number of pores used as an upper electrode, these plates were installed parallel to and opposing each other at an interval of 24 mm within a reaction chamber. A temperature of the lower stage was kept at 400° C. at all times. The gas within the reaction chamber was constantly exhausted using a vacuum pump and the pressure was maintained at a stated pressure.

The wafer of a substrate on which a film is formed was set in the lower stage, 120 sccm of Dimethyldimetoxysilane (DM-DMOS): $(CH_3)_2Si(OCH_3)_2$ and He:100 sccm were mixed, and the mixed gas was brought into a reaction chamber as a reaction gas through the pores of the upper electrode. A pressure within the reaction chamber was maintained at $6.7\times10^2$ Pa, the lower stage was electrically grounded and 1200W 13.56 MHz RF power was applied to an upper electrode to form a film on a wafer substrate. The measured dielectric constant of a film formed under these conditions was 2.76.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method for forming by plasma CVD a thin film on a semiconductor substrate placed on a lower stage in a reaction chamber comprised of an upper region and a lower region, comprising the steps of:

introducing a reaction gas comprising a precursor gas for a film-to-be-deposited into the upper region where the reaction gas is subjected to plasma excitation; and forming a thin film on the substrate in the lower region where no electric potential is applied to suppress plasma excitation, thereby reducing or discharging an electric charge from the substrate surface during formation of the film.

2. The method according to claim 1, wherein the pressure of the reaction chamber is 100–5000 Pa.

3. The method according to claim 2, wherein the reaction gas comprises a precursor gas containing Si which is introduced into the upper region of the reaction chamber.

4. The method according to claim 2, wherein said reducing or discharging is further conducted by lowering the temperature of the lower stage to condense moisture molecules present in the reaction chamber on the substrate, thereby discharging an electric charge from the substrate surface.

5. The method according to claim 4, wherein plasma is excited between an upper electrode and the lower stage, the temperature of the lower stage being in the range of −10° C.–150° C., the temperature of the intermediate plate being in the range of 50° C.–200 ° C., the temperature of the upper electrode being 100° C. or higher, wherein the temperature of the lower stage is lower than that of the intermediate plate and the upper electrode.

6. The method according to claim 1, wherein the upper region and the lower region are divided by an electrically conductive intermediate plate having plural pores through which the reaction gas passes, wherein substantially no electric potential is applied between the intermediate plate and the lower stage.

7. The method according to claim 6, wherein the intermediate plate and the lower stage are electrically connected to maintain the intermediate plate and the lower stage at the same voltage.

8. The method according to claim 6, wherein an upper electrode is placed above the intermediate plate in the upper region, and plasma is excited between the upper electrode and the intermediate plate.

9. The method according to claim 8, wherein pulse-modified power is applied between the upper electrode and the intermediate plate.

10. The method according to claim 1, wherein said reducing or discharging is conducted by lowering the temperature of the lower stage to condense moisture molecules present in the reaction chamber on the substrate, thereby discharging an electric charge from the substrate surface.

11. The method according to claim 10, wherein plasma is excited between an upper electrode and the lower stage, the temperature of the lower stage being lower than room temperature, the temperature of the upper electrode being 150° C. or higher.

12. The method according to claim 10, wherein the moisture molecules are produced from oxygen and hydrogen present in the reaction gas.

13. A film formed by a method of claim 1 using a silicon-containing gas, which has nano-pores having a median diameter of 10 nm or less and has a low dielectric constant of 2.5 or lower.

14. A method for forming by plasma CVD a thin film on a semiconductor substrate placed on a lower stage in a reaction chamber comprised of an upper region and a lower region divided by an electrically conductive intermediate plate having plural pores through which a reaction gas passes, comprising the steps of:

introducing a reaction gas comprising a precursor gas of a film-to-be-deposited into the upper region;

applying RF power to the upper region to subject the reaction gas to plasma excitation, wherein substantially no electric potential is applied in the lower region to suppress plasma excitation therein, thereby reducing an electric charge from the lower region, and forming a thin film on the substrate in the lower region using radical species of the precursor passing through the intermediate plate, wherein an electric charge from the substrate surface is reduced or discharged when the thin film is formed.

15. The method according to claim 14, wherein the lower region has a temperature lower than that of the upper region.

16. The method according to claim 14, wherein the precursor gas contains Si.

* * * * *